United States Patent
Sato et al.

(10) Patent No.: US 10,788,812 B2
(45) Date of Patent: Sep. 29, 2020

(54) OBJECT-SURFACE CORRECTING METHOD, AND PROCESSING METHOD AND PROCESSING SYSTEM FOR WORKPIECE

(71) Applicants: NATIONAL UNIVERSITY CORPORATION KOBE UNIVERSITY, Kobe-shi (JP); MAKINO MILLING MACHINE CO., LTD., Tokyo (JP)

(72) Inventors: Ryuta Sato, Kobe (JP); Takumi Nakanishi, Kobe (JP); Mitsunari Oda, Aiko-gun (JP); Nobu Nakayama, Aiko-gun (JP)

(73) Assignees: NATIONAL UNIVERSITY CORPORATION KOBE UNIVERSITY, Kobe-shi, Hyogo (JP); MAKINO MILLING MACHINE CO., LTD., Tokyo (JP)

( * ) Notice: Subject to any disclaimer, the term of this patent is extended or adjusted under 35 U.S.C. 154(b) by 78 days.

(21) Appl. No.: 16/080,530

(22) PCT Filed: Feb. 28, 2017

(86) PCT No.: PCT/JP2017/007999
§ 371 (c)(1),
(2) Date: Aug. 28, 2018

(87) PCT Pub. No.: WO2017/150578
PCT Pub. Date: Sep. 8, 2017

(65) Prior Publication Data
US 2019/0064771 A1     Feb. 28, 2019

(30) Foreign Application Priority Data
Feb. 29, 2016   (JP) .................. 2016-038223

(51) Int. Cl.
*G05B 19/4097* (2006.01)
*G01N 21/27* (2006.01)
(Continued)

(52) U.S. Cl.
CPC ......... *G05B 19/4097* (2013.01); *G01N 21/27* (2013.01); *G01N 21/47* (2013.01);
(Continued)

(58) Field of Classification Search
CPC ...... G05B 19/4097; G05B 2219/37402; G06F 17/50; G06T 15/50; G01N 21/47; G01N 21/27
See application file for complete search history.

(56) References Cited

U.S. PATENT DOCUMENTS

| | | |
|---|---|---|
| 6,246,416 B1 | 6/2001 | Stam |
| 6,298,279 B1 | 10/2001 | Shimada et al. |
| 2016/0054724 A1 | 2/2016 | Oda |

FOREIGN PATENT DOCUMENTS

| | | |
|---|---|---|
| JP | 11-123657 | 5/1999 |
| JP | 2000-40164 | 2/2000 |

(Continued)

OTHER PUBLICATIONS

International Search Report dated May 23, 2017, directed to International Application No. PCT/JP2017/007999; 2 pages.

*Primary Examiner* — Robert E Fennema
*Assistant Examiner* — Shon G Foley
(74) *Attorney, Agent, or Firm* — Merchant & Gould P.C.

(57) ABSTRACT

In the present invention: a plurality of meshes are defined on an object surface; the luminance of the object surface when the object surface is viewed from a viewpoint position is calculated for each of the plurality of meshes on the basis of data concerning a processed shape, a surface roughness curve, the viewpoint position, the direction, angle distribu-
(Continued)

tion, and intensity of incident light onto the object surface, and a reflectance and scattering characteristics for each wavelength on the object surface; the shape of the object surface is displayed on the basis of the luminances; and data concerning at least the object shape or the surface roughness curve is corrected so as to obtain a desired appearance of the object surface.

6 Claims, 14 Drawing Sheets

(51) Int. Cl.
    *G01N 21/47*     (2006.01)
    *G06T 15/50*     (2011.01)
    *G06F 30/00*     (2020.01)

(52) U.S. Cl.
    CPC .............. *G06F 30/00* (2020.01); *G06T 15/50* (2013.01); *G05B 2219/37402* (2013.01)

(56) References Cited

FOREIGN PATENT DOCUMENTS

| | | |
|---|---|---|
| JP | 2009-282909 | 12/2009 |
| JP | 2015-64674 | 4/2015 |
| WO | 2014/155727 | 10/2014 |
| WO | 2015/027196 | 2/2015 |

FIRST MATERIAL

SECOND MATERIAL

M

M

M

OBJECT-SURFACE CORRECTING METHOD, AND PROCESSING METHOD AND PROCESSING SYSTEM FOR WORKPIECE

CROSS REFERENCE TO RELATED APPLICATIONS

This application is a U.S. National phase patent application of International Patent Application No. PCT/JP2017/007999, filed Feb. 28, 2017, which claims priority to Japanese Patent Application No. JP 2016-038223, filed Feb. 29, 2016, the contents of which are hereby incorporated by reference in the present disclosure in its entirety.

FIELD OF THE INVENTION

The present invention relates to a method for accurately predicting, in advance, the aesthetic of the shape of an object surface (machined surface) as observed by the human eye and correcting the shape of the object surface, and a workpiece machining method.

BACKGROUND OF THE INVENTION

When machining with an NC machine tool, aesthetic issues may occur on the machined surface due to machining errors of the NC machine tool. However, it has been empirically known that the absolute value of the magnitude of the machining error and the observed impression aesthetic issues do not always match. The aesthetic impression is thought to be influenced by characteristics of the human eye, such as the contrast sensitivity curve. Thus, methods for evaluating the aesthetics of finished machined surfaces have been proposed.

Patent Literature 1 discloses a machined surface evaluation method in which the maximum luminance and minimum luminance of reflected light on a machined surface are calculated, the contrast between the maximum luminance and the minimum luminance is calculated, the spatial frequency of the machined surface is calculated, and based on the contrast and the spatial frequency, it is determined, using a contrast sensitivity function, whether or not the contrast of the machined surface can be detected by the human eye.

Patent Literature 2 discloses an image generating device in which an image of an object is generated based on shape information of the object and viewpoint information, and based on the shape information of the object and the viewpoint information, reflection or refraction information of the object surface is calculated, and an image is generated by combining the generated image of the object and the reflection or refraction information.

PATENT LITERATURE

[PTL 1] WO 2014/155727
[PTL 2] JP-A-2000-040164

BRIEF SUMMARY OF THE INVENTION

In the aforementioned prior art, the evaluation is based on image data obtained by photographing the machined surface. Thus, it is possible to judge the quality of machined surface after machining. However, since the relationship between the shape of the machined surface and aesthetics as observed by the human eye is unclear, the aesthetics of the shape of the object surface (machined surface) as observed by the human eye cannot be precisely predicted in advance, and an object surface shape of the desired aesthetic cannot be obtained.

The present invention aims to solve such problem of the prior art as a technical problem, and aims to provide a method for accurately predicting, in advance, the aesthetic of the shape of an object surface (machined surface) as observed by the human eye, whereby the shape of the object surface can be corrected and a workpiece machining method.

In order to achieve the above object, according to the present invention, there is provided an object surface correction method for predicting whether a shape of an object surface can be recognized by the human eye and correcting the object surface based on the prediction, comprising:
  when the shape of the object surface is predicted based on data related to a shape of an object, a surface roughness curve, a viewpoint position, incident light, and reflected light,
  dividing the object surface into a plurality of regions,
  calculating, for each of the plurality of regions, a luminance of the object surface when the object surface is observed from the viewpoint position based on the data,
  predicting, based on the calculated luminance, whether the shape of the object surface can be recognized by the human eye, and
  correcting, based on the predicted shape of the object surface, the data related to at least one of the shape and surface roughness curve of the object so as to obtain a desired aesthetic of the object surface.

Furthermore, according to the present invention, there is provided a workpiece machining method for driving a machine tool to machine a workpiece based on a machining program generated by a CAM device for obtaining a desired workpiece shape, comprising:
  when a shape of an object surface is predicted based on data related to a machining shape of the workpiece, a surface roughness curve of a surface thereof, a viewpoint position, incident light, and reflected light,
  dividing the object surface into a plurality of regions,
  calculating, for each of the plurality of regions, a luminance of the object surface when the object surface is observed from the viewpoint position based on the data,
  predicting, based on the calculated luminance, whether the shape of the object surface can be recognized by the human eye, and
  correcting, based on the predicted shape of the object surface, the data related to at least one of the shape of the object and surface roughness curve so as to obtain a desired aesthetic of the object surface.
  changing the data related to at least one of the shape of the object and the surface roughness curve based on the predicted shape of the object surface so as to obtain a desired object surface aesthetic, and
  driving the machine tool based on the changed data to machine the workpiece.

Further, according to the present invention, there is provided a machining system, comprising
  a machine tool, and
  an object surface prediction display device which, when a shape of an object surface is predicted based on data related to a shape of an object to be machined by the machine tool, a surface roughness curve, a viewpoint position, incident light and reflected light:

divides the object surface to be machined by the machine tool into a plurality of regions, calculates, for each of the regions, a luminance of the object surface when the object surface is observed from the viewpoint position based on the data related to the shape of the object and the surface roughness curve, and predicts whether the shape of the object surface can be recognized by the human eye based on the calculated luminance, and can correct the data related to at least one of the shape of the object and the surface roughness curve based on the predicted shape of the object surface so as to obtain a desired object surface aesthetic.

According to the embodiments of the present invention, when the shape of the object surface is actually produced, it is possible to predict in advance how the shape of the object surface will be visually recognized by an observer, and when, for example, machining a workpiece with a numerical control machine tool, it is possible to change the shape of the machined surface, the tool path, and the machining conditions in the CAD/CAM device, and to change the set values of acceleration/deceleration time constant, gain constant and other correction parameters of the C device to create the desired machined surface.

DETAILED DESCRIPTION OF THE INVENTION

First, visibility of the object surface of the present invention will be described with reference to FIGS. 3 to 6B.

Figure 3:
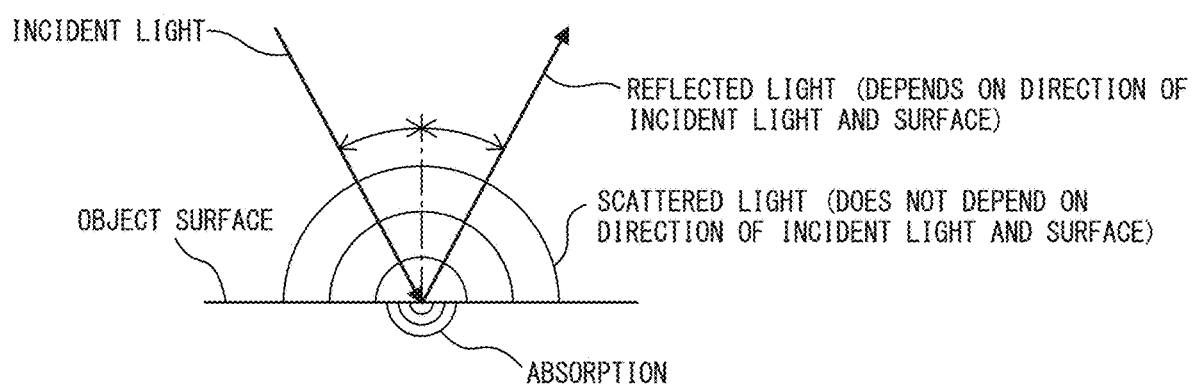
FIG. 3 is a schematic diagram detailing incident light, regular reflected light, scattered light, and absorbed light on the object surface.

In general, humans recognize the shape and texture of objects by observing the intensity (luminance) of the light reflected by the surface of the object. Referring to FIG. 3, which schematically shows the reflection and scattering when light is irradiated onto the surface of an object, depending on the properties of the material of which the object is composed, a part of the incident light is absorbed and a part of the incident light is scattered by variations in the shape of the surface which are finer than the wavelength of the incident light in addition to the properties of the material. The scattered light propagates substantially equally in all directions regardless of the macroscopic direction of the object surface. The direction of regular light reflected due to the variations of the surface shape larger than the wavelength of the incident light is determined based on the relationship between the incident light and the direction of the object surface.

When all incident light is reflected (re-radiated) as scattered light, since the reflected light propagates in all directions regardless of the orientation or shape of the surface of the object, the orientation and shape of the object surface cannot be visually recognized, namely, visibility is deteriorated. Conversely, if the component of the incident light reflected as scattered light is small, and the regularly reflected light component is large, the orientation and shape of the object surface can be easily recognized visually, whereby visibility is improved.

Figure 4:
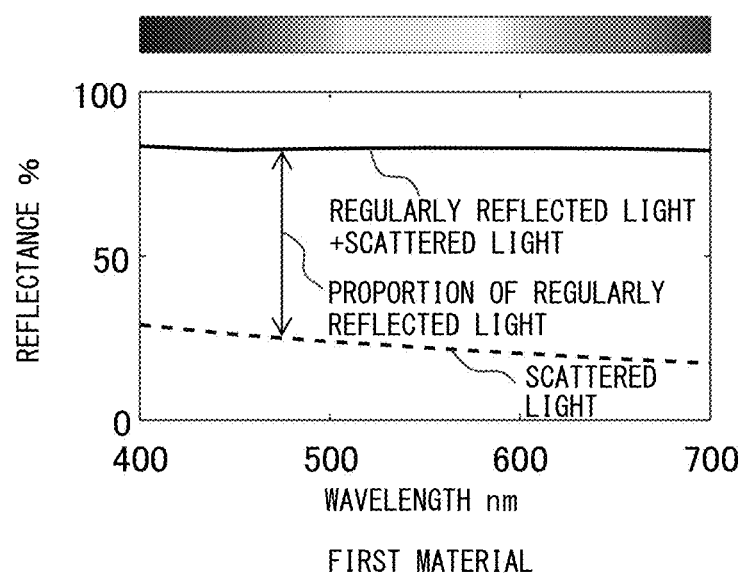
FIG. 4 shows graphs illustrating an example of measurement results of the reflection characteristics of the object surface.
Figure 4:
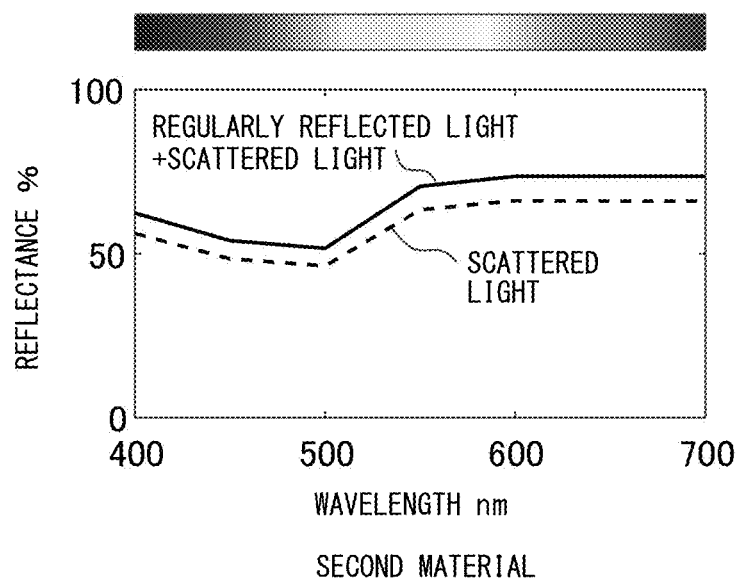

Furthermore, if the reflectance differs for each wavelength of incident light, such difference is recognized as a change in the color of the object surface. FIG. 4 shows the measurement results of reflection characteristics with respect to wavelength for two types of metallic materials. In FIG. 4, the reflectance, which is the sum of regularly reflected light and scattered light, is indicated by the solid line and the reflectance of only scattered light is indicated by the broken line. The fact that the reflectance indicated by the solid line is not 100% indicates absorption by the object surface. In the first material, the proportion of scattered light is small, and almost the same reflectance is obtained for all wavelengths, whereby a glossy whitish surface is observed. In the second material, the ratio of the scattered light is large and the reflectance at short wavelengths is low, whereby a glossy reddish surface is observed.

Figure 5:
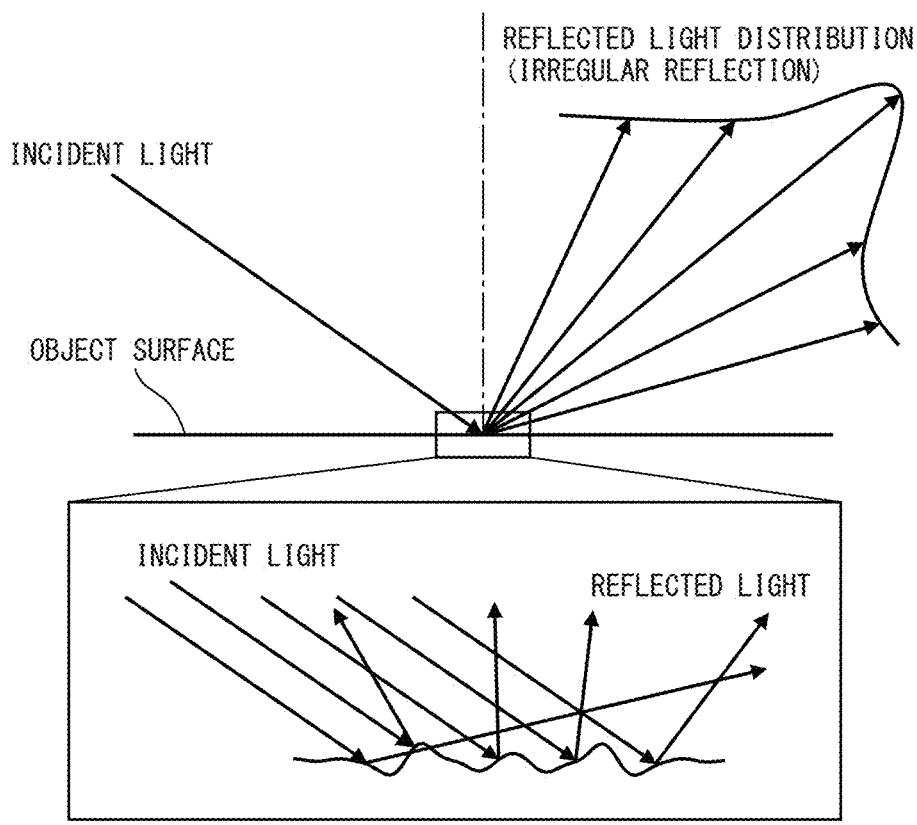
FIG. 5 is a schematic diagram detailing diffused reflections due to surface roughness.

In surfaces machined by cutting machining or the like, the amplitude and/or wavelength of the surface roughness curve is often larger than the wavelength of incident light. In such a case, the light incident onto the object surface diffusely reflects due to the surface irregularities as shown in FIG. 5. Even when light is incident from a constant direction, when the direction of the object surface changes, the direction of reflected light changes variously and the light reflects with an angular distribution to the direction of reflected light when perfect planar light is incident. Even in such a case, as in the case where the ratio of the scattered light is large, the shape change of the object surface cannot be clearly visually recognized, whereby visibility is deteriorated.

Figure 6A:
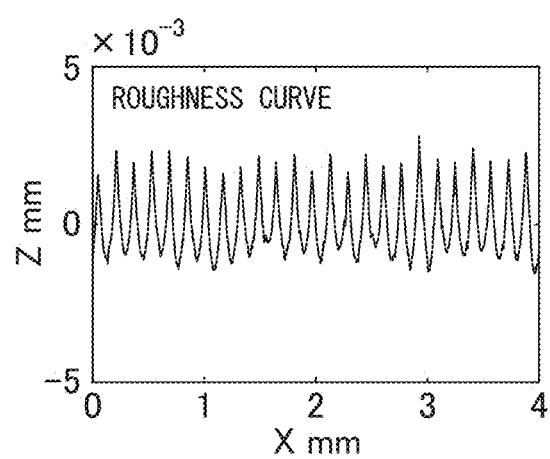
FIG. 6A shows graphs illustrating the relationship between surface roughness and the angular distribution of reflected light on a surface having high surface roughness.
Figure 6A:
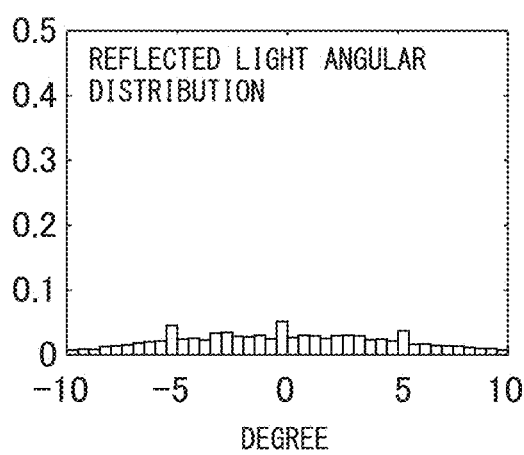
Figure 6B:
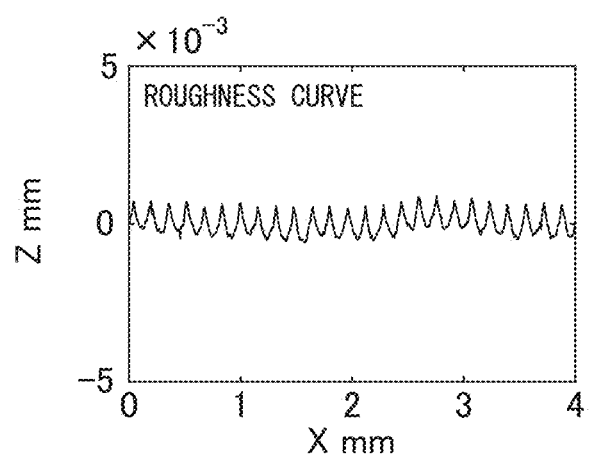
FIG. 6B shows graphs illustrating the relationship between surface roughness and the angular distribution of reflect light on a surface having low surface roughness.
Figure 6B:
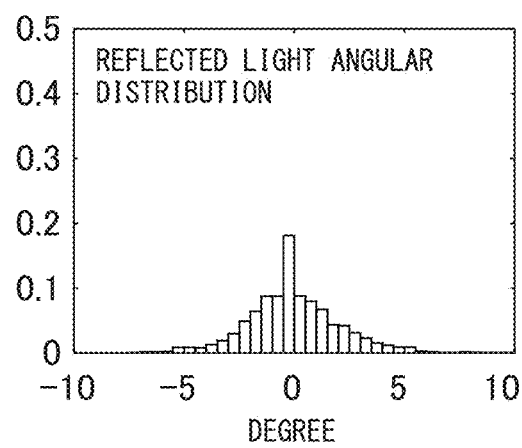

The angular distribution of the reflected light can be geometrically calculated from the surface roughness curve of the object. FIGS. 6A and 6B show examples in which the roughness curves of machined metal surfaces are measured and the angular distributions of the reflected light are found by calculation based on the roughness curves. When the surface roughness is large (FIG. 6A), the angular distribution of reflected light expands, and it becomes difficult to visually recognize the shape change of the machined surface, whereby visibility is deteriorated. As the surface roughness decreases (FIG. 6B), the angular distribution of reflected light narrows and it becomes easier to visually recognize the shape change of machined surface, whereby visibility is improved.

For example, in Non-Patent Literature 1, when observing a metal surface from a distance of 250 mm, the resolution of the human eye is about 0.25 mm, that is, a wavelength of the surface roughness curve of 0.25 mm or more will not be recognized as surface roughness but will be visually perceived as shape change. Assuming observation with the human eye, namely, the naked eye, reflected light from the machined surface is generally recognized as scattered light when the wavelength of the surface roughness of the machined surface is several hundred nm or less. Reflected light on the order of several hundred nm to several hundred μm is recognized as reflected light, and it is deemed that such light is recognized as a shape change in the case of several hundred μm or more. In the present application, "shape change" means a shape intentionally provided on the object surface or a locally generated step or shape error and "surface roughness" means periodic concavities and convexities of several hundred microns or less partially spreading over the entire object surface or over a certain range.

Predicting how the surface of an object (product) looks when viewed with the human eye is important when manufacturing a product. For example, when a workpiece is machined with a machine such as a milling machine, it is important to design the workpiece and determine the machining conditions of workpiece considering visibility and how the machined surface of the workpiece will look when viewed with the human eye.

Figure 1:
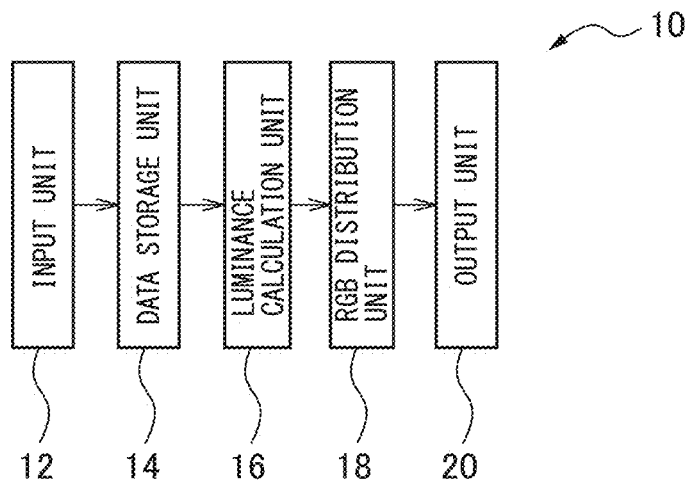
FIG. 1 is a block diagram of an object surface prediction display device according to a preferred embodiment of the present invention.

Referring to FIG. 1, a preferred embodiment of an object surface prediction display device of the present invention is depicted which predictively shows how the object surface will look when observed with the human eye. The object surface prediction display device 10 (hereinafter described simply as a prediction display device 10) includes, as primary constituent elements, an input unit 12, a data storage unit 14, a luminance calculation unit 16, an RGB distribution unit 18, and an output unit 20. The prediction display device 10 can be constituted of an electronic device such as, for example, a computer comprising RAM, ROM, a CPU, a hard-drive, an SSD, and input/output ports mutually connected through bidirectional busses.

The input unit 12 can be constituted by a keyboard for inputting various data to the data storage unit 14, a touch panel, or a nonvolatile memory, such as, for example, USB memory, which is capable of communicating with a server or personal computer connected to the prediction display device 10 via communication means such as a computer network such as a LAN, or input/output ports of the prediction display device 10.

The data storage unit 14 can be formed from a storage device such as a hard drive or an SSD and includes a shape data storage area for storing data related to the shape of the object or the machining shape of the workpiece, a surface roughness curve storage area for storing data related to the surface roughness curve of the object surface, a viewpoint position storage area for storing data related to the viewpoint position of the observer relative to the object surface, for example, coordinate positions, an incident light storage area for storing data related to incident light such as the direction, angular distribution, and intensity of the incident light, and a reflected light storage area for storing data related to the reflectance and scattering characteristics of each wavelength of light incident on the object surface.

The luminance calculation unit 16 calculates the luminance of the light reflected by the object surface and the light scattered by the object surface based on the data stored in the data storage unit 14, as will be described later. The RGB distribution unit 18 converts the luminance of the light reflected by the object surface and the light scattered by the object surface obtained by the luminance calculation unit 16 into R (red), G (green), and B (blue) luminance values based on the reflectance of each wavelength of light incident on the object surface stored in the data storage unit 14, as will be described later. The output unit 20 can be formed from a display device such as a liquid crystal panel or a color printer and displays or prints the object surface based on each of the R (red), G (green), and B (blue) luminance values obtained by the RGB distribution unit 18 so as to be visually recognizable by an operator.

Figure 2:
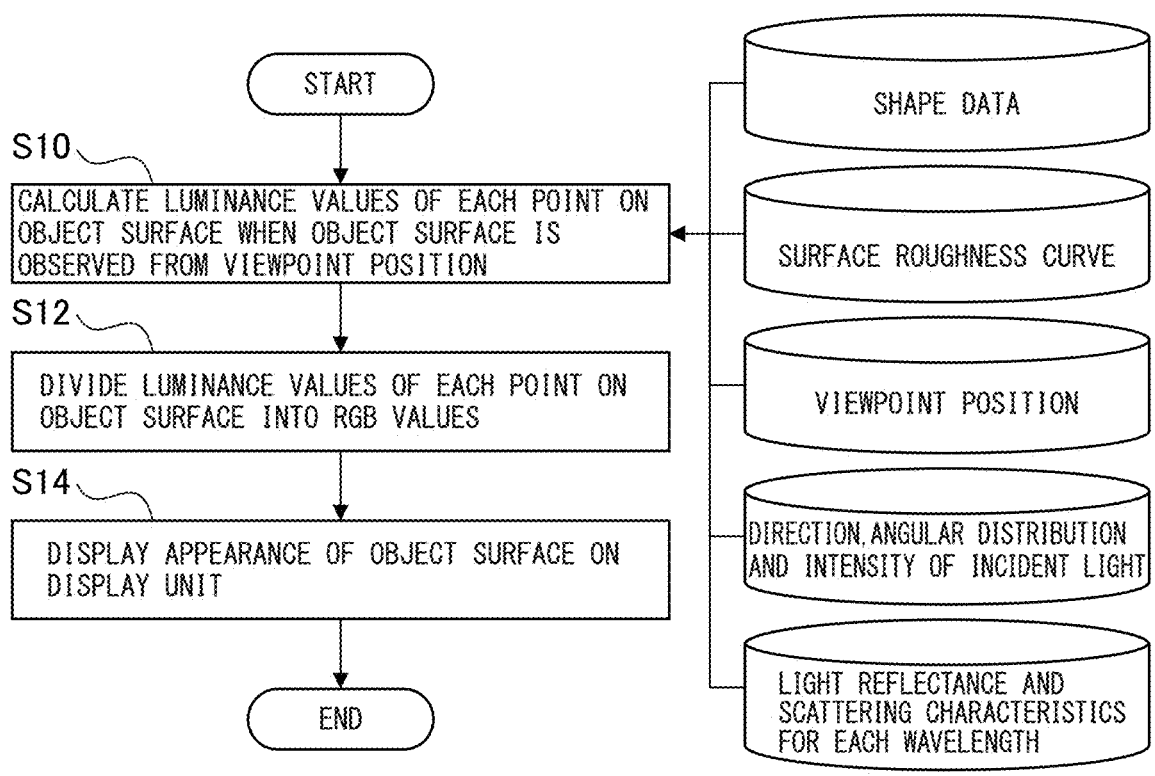
FIG. 2 is a flowchart showing the object surface prediction display method according to the preferred embodiment of the present invention.

Next, the operation of the prediction display device 10 will be described with reference to the flowchart shown in FIG. 2.

First, object shape data (workpiece machining shape), data related to the surface roughness curve, data related to the viewpoint position, data related to the incident light and data related to the reflected light are input from the input unit 12 to the data storage unit 14. This data may be data based on measurement results, data based on simulation results from mathematical models, data based on predictions from a database, or a combination thereof.

For example, when prediction results obtained by simulation using mathematical models are used for the shape data, it is possible to predict in advance how the machined surface will be visually perceived by the observer when actually producing such a shape. In order to perform a simulation using a mathematical model, tool conditions, machining conditions and other parameters are input to the simulator, as will be described later. The tool conditions can include the tool type, the tool diameter, the optimum cutting speed, etc. The machining conditions can include pick feed, feed speed, spindle rotation speed, etc. The parameters can include the acceleration/deceleration time constant, the gain constant and other correction parameters of the NC device.

Figure 7:
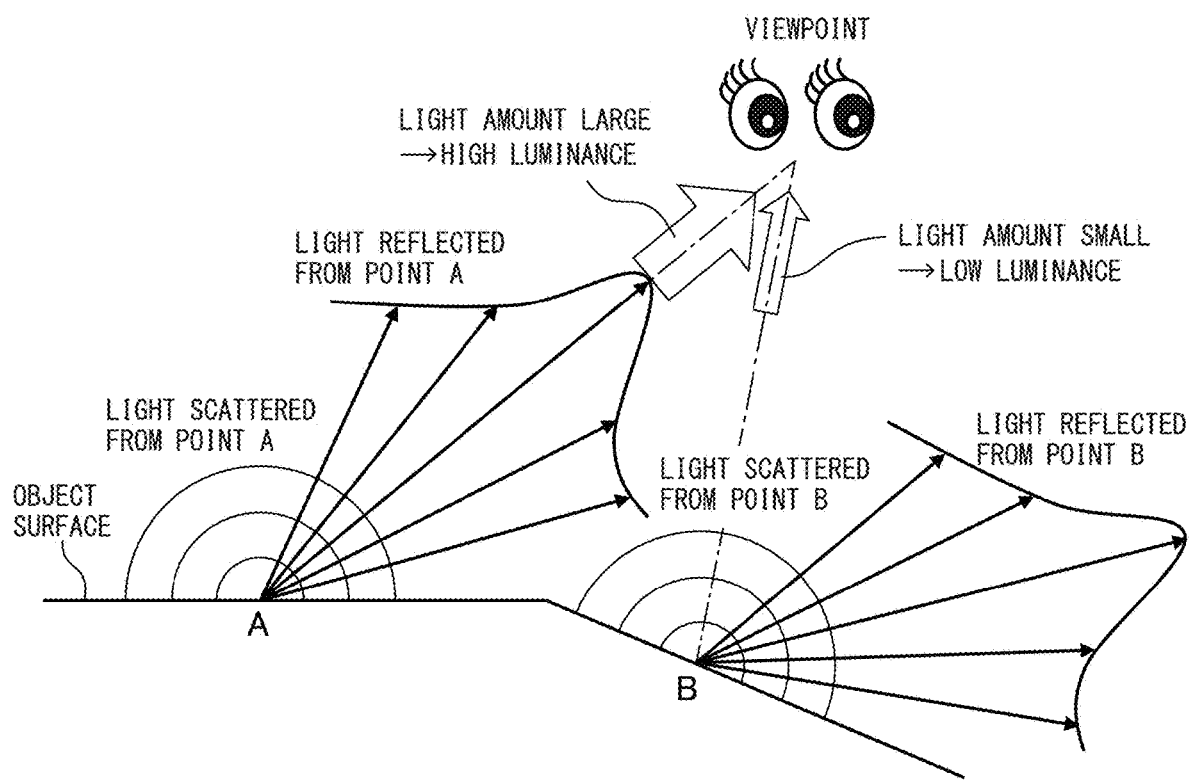
FIG. 7 is a schematic diagram detailing a luminance calculation method taking object surface characteristics into account.

The luminance calculation unit 16 reads this data from the data storage unit 14, and calculates (step S10) the luminance values of each point on the object surface when the object surface is observed from the viewpoint position. The luminance of a certain point on the object surface when observed from a certain viewpoint is the total amount of light incident on the viewpoint from the certain point on the object surface. Referring to FIG. 7, the luminance of point A on the object surface is obtained as the sum of the components parallel to the straight line connecting point A and the viewpoint from among the light scattered from point A and the light reflected from point A. Likewise, the luminance of point B, which is different from point A, is the sum of the components parallel to the straight line connecting point B and the viewpoint from among the light scattered from point B and the light reflected from point B.

Figure 8:
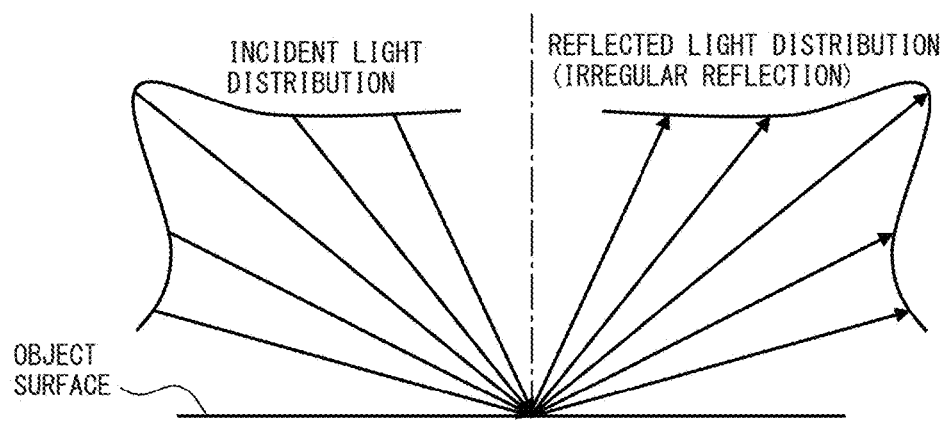
FIG. 8 is a schematic diagram detailing the angular distribution of incident light and the angular distribution of reflected light.
Figure 9:
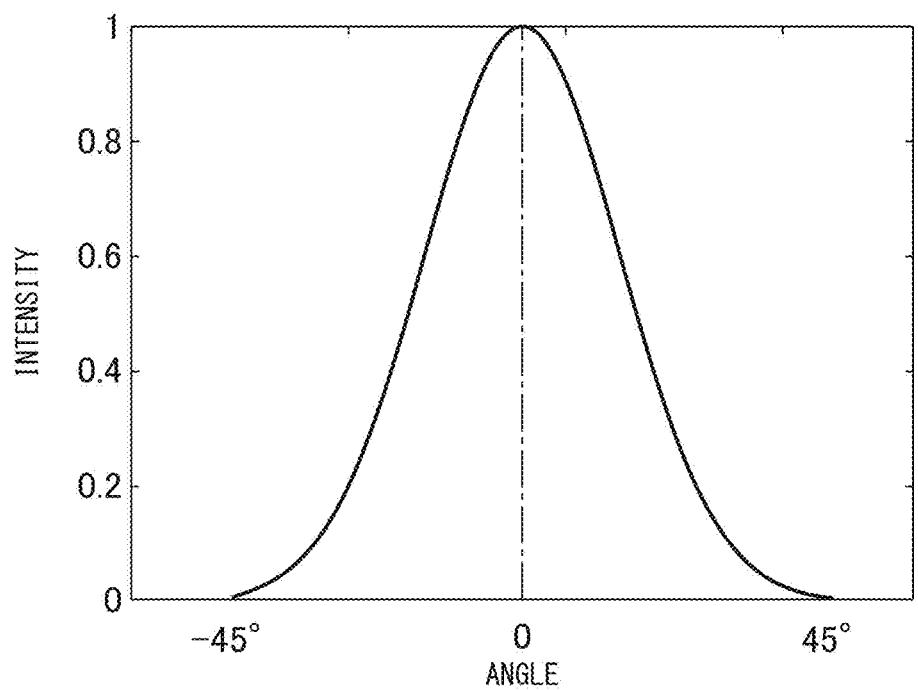
FIG. 9 is a graph illustrating an example of the angular distribution of incident light.

As incident light, for example, solar rays can be regarded as parallel rays from a single direction, though in reality, incident light also includes light reflected and scattered from the surrounding environment, and is not completely parallel light rays from a single direction. Likewise, even in a room, incident light is not completely parallel light rays from a single direction, but rather incident light has an angular distribution as schematically shown in FIG. 8. Thus, even when the incident light has an angular distribution, the reflected light for the incident light from each direction can be calculated and superimposed to obtain the angular distribution of reflected light. The angular distribution of incident light can be expressed as a change in intensity with respect to a change in angle from the center of the incident light wherein the intensity of the light incident from each direction is measured or assumed and the direction in which the intensity is maximum is set as the center of the incident light, as shown in, for example, FIG. 9. In FIG. 9, the intensity of the light incident from each direction is normalized by the intensity of the incident light of the center.

The luminance Ir of the light incident on the viewpoint from the object surface can be calculated by the following formula described in, for example, "A Reflectance Model for Computer Graphics" published in the "ACM Transaction on Graphics, Vol. 1, No. 1, January 1982, pp. 7-24".

$$I_r = I_{ia}R_a + \sum_l I_{il}(N \cdot L_l)d\omega_{il}(sR_s + dR_d)$$ [EQUATION 1]

where:
$I_{ia}R_a$: Intensity of ambient light
$I_{il}$: Intensity of incident light
s: Ratio of scattered light
d: Ratio of reflected light
$d\omega_{il}$: Solid angle of incident light
$R_s$: Reflectance of scattered light
$R_d$: Reflectance of reflected light The luminance calculated by the luminance calculation unit 16 is distributed in the RGB distribution unit 18 into each luminance value of R (red), G (green), and B (blue) taking into consideration the difference in reflectance of each wavelength of light incident on the object surface (step S12). More specifically, using the reflectance Rr (red, 700 nm), Rg (green, 546 nm), and Rb (blue, 436 nm) for each wavelength as measured by a spectrophotometer, the total luminance of each wavelength is distributed into luminance R, luminance G, and luminance B so that the total luminance becomes the luminance Ir calculated in the luminance calculation unit 16.

$$R = \frac{Rr}{Rr+Rg+Rb}I,$$ [EQUATION 2]

$$G = \frac{Rg}{Rr+Rg+Rb}I, B = \frac{Rb}{Rr+Rg+Rb}I,$$

By dividing the object surface into appropriate meshes, such as rectangles or triangles, and performing the above processing for each mesh, considering the characteristics of the object surface (surface characteristics), such as surface roughness, reflectance, and scattering, the object surface is displayed on the output unit 20, for example, on a liquid crystal display or, alternatively, printed by a color printer (step S14).

Note the shape of the meshes is not limited to rectangles or triangles, and the object surface can be divided into any appropriate shapes. Furthermore, the shapes may differ between adjacent meshes.

Figure 10A:
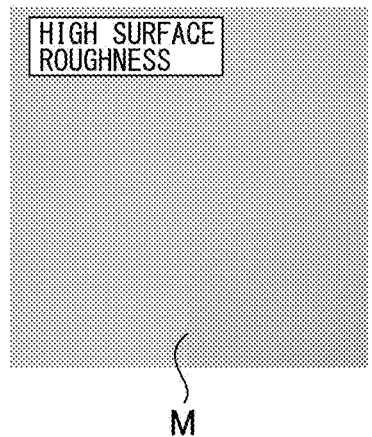
FIG. 10A is a photograph of a printout illustrating object surface prediction results according to the present invention when surface roughness is high.
Figure 10B:
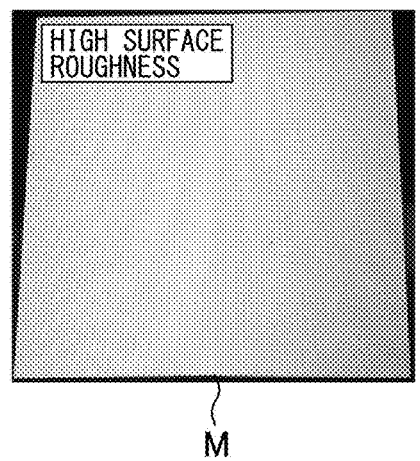
FIG. 10B is a captured photograph of a machined surface of a workpiece (object) actually produced under the same conditions as in FIG. 10A.
Figure 10C:
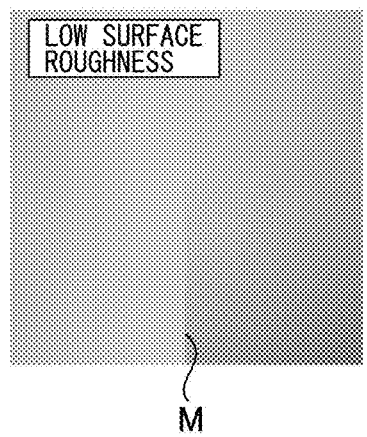
FIG. 10C is a photograph of a printout illustrating object surface prediction results according to the present invention when surface roughness is low.
Figure 10D:
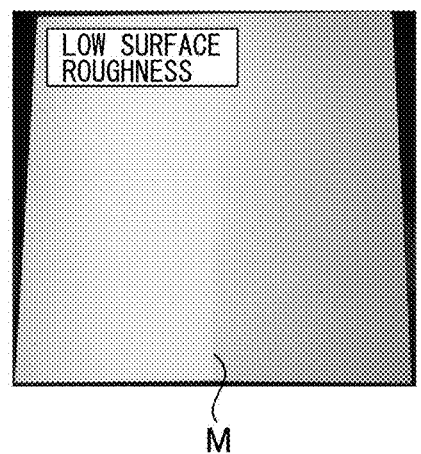
FIG. 10D is a captured photograph of a machined surface of a workpiece (object) actually produced under the same conditions as in FIG. 10C.

FIGS. 10A to 10D show results of the actual predictions of the appearance of object surfaces to the human eye made by the prediction display device 10 of the present embodiment. FIGS. 10A and 10B show cases in which the surface roughness is high as compared to FIGS. 10C and 10D, FIGS. 10A and 10C show printed prediction results, and the images on the lower sides in FIGS. 10B and 10D are photographs of the surfaces of actually produced workpieces (objects).

In FIGS. 10A to 10D, a relatively clear line, as indicated by reference symbol "M", can be seen at the center of the object surface since the normal direction of the object surface changes near the center thereof. According to the prediction display device 10 of the present embodiment, it can be seen from FIGS. 10A to 10D that, in both the prediction results and the photograph of the actual object surface, when surface roughness is low and irregular reflection is small, the shape change around the center can be observed more clearly, and when the surface roughness is high, it is difficult to recognize shape change visually. As described above, according to the prediction display device 10 according to the present embodiment, it is possible to predict how the object surface will look when observed with the human eye considering the surface roughness of the object surface.

The shape data, data related to the surface roughness curve, and data related to the viewpoint position stored in the data storage unit 14 can be, for example, determined in advance as a specification or actually measured, or alternatively, may be relatively accurate data input by a mathematical model. However, it may not be possible to actually measure the data related to incident light (the direction, angular distribution, and intensity of the incident light) and the data related to the reflected light (the reflectance and scattering characteristics of each wavelength of light) and predicting the same is often difficult, which may affect the prediction results. Further, the results may differ depending on the characteristics of the display or printer constituting the output unit 20.

When the observation results of an actually produced object surface (workpiece machined surface) and the prediction results of the prediction display device 10 are compared, if the actual appearance as observed by the human eye and the prediction results are different, it is necessary to once again predict the object surface (workpiece machined surface) using the data related to incident light (the direction, angular distribution, intensity, etc., of the incident light) and the data related to the reflected light (the reflectance, scattering characteristics, etc., of each wavelength of light). By changing the direction, angular distribution, intensity and scattering characteristics of incident light, the brightness of the object surface and the visibility of shape change changes, and by changing the reflectance of each wavelength of light incident on the object surface (workpiece machined surface), the color of the object surface changes. Repeating such correction of the data until the actual appearance matches the prediction results and calibrating this data enables a more accurate prediction.

By storing the data related to incident light (the direction, angular distribution, intensity, etc., of the incident light) and the data related to reflected light (the reflectance, scattering characteristics, etc., of each wavelength of light) configured in this way, when the shape data, data related to the surface roughness curve, and data related to the viewpoint position are changed, it becomes possible to predict how the object surface will be visually recognized by the human eye. When a workpiece is cut by, for example, a numerically controlled machine tool, it is possible to change the shape, tool path, and machining conditions of the machined surface in the CAD/CAM device or change the set values of the acceleration/deceleration time constant, gain constant and other correction parameters of the NC device to create the desired machined surface.

Figure 11:
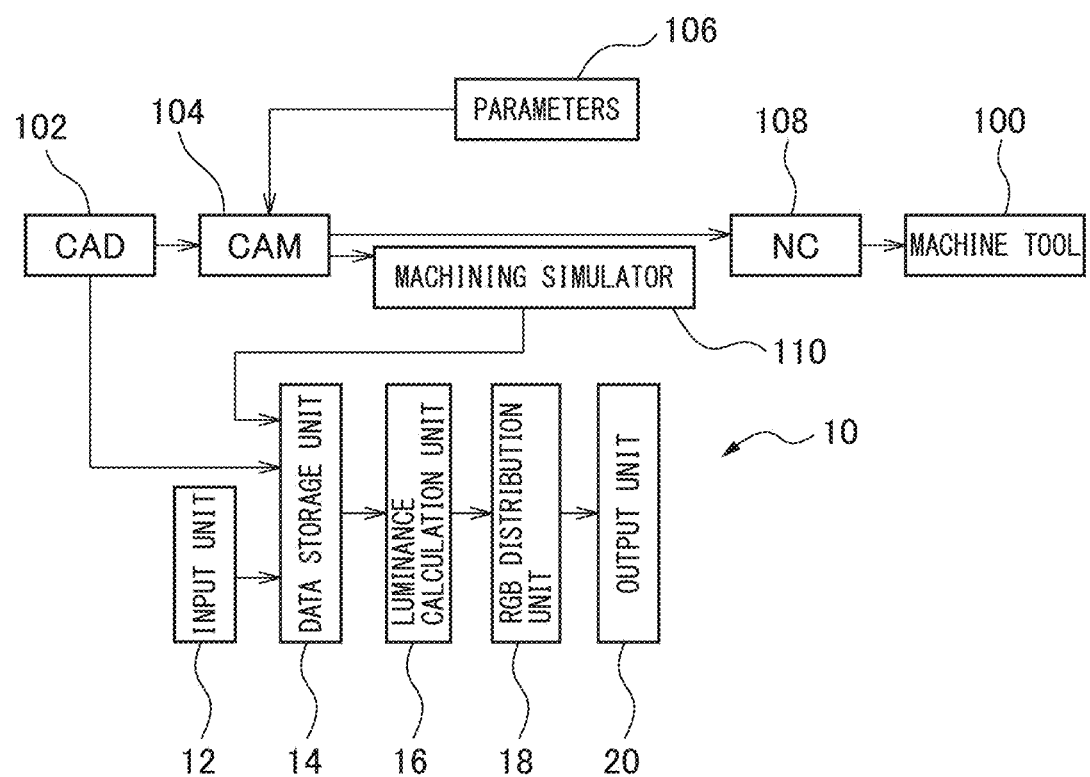
FIG. 11 is a block diagram showing an embodiment in which the prediction display device of the object surface of FIG. 1 is combined with a CAD/CAM device.

FIG. 11 shows an embodiment in which the prediction display device 10 of the present invention is combined with a CAD/CAM device supporting a machine tool 100. In FIG. 11, the design data of the workpiece generated by the CAD device 102 is sent to the CAM device 104 and also input to the data storage unit 14 as machining shape data of the workpiece. Based on the design data from the CAD device 102, the CAM device 104 generates a machining program for machining the workpiece with the machine tool 100. The machining program generated by the CAM device 104 is output to the NC device 108 of the machine tool 100. Based on the machining program, the NC device 108 outputs a current for driving the servo motor of each feed shaft (not shown) of the machine tool 100.

The machining program generated by the CAM device 104 includes information related to the path of the tool (tool path) relative to the workpiece. Furthermore, tool conditions, machining conditions and other parameters 108 are input to the CAM device 104. The tool conditions include the tool type, the tool diameter, optimum cutting speed, etc. The machining conditions include pick feed, feed speed, spindle rotation speed, etc.

The tool path, machining conditions, and parameters are output from the CAM device 104 to the machining simulator 110. The machining simulator 110 simulates, using a computer, machining with the machine tool 100 based on the tool path, machining conditions, and parameters from the CAM device 104. The machining simulator 110 outputs data related to the surface roughness curve of the machined surface of the workpiece after machining to the data storage unit 14. The surface roughness curve of the machined surface of the workpiece can be obtained by calculating the cusp height from the pick feed and the tool diameter. The cusp height can be calculated using the following formula.

$$h = R - \sqrt{R^2 - \frac{x^2}{4}}$$ [EQUATION 3]

where
x is the pick feed, and
R is the tool diameter.

Figure 12:
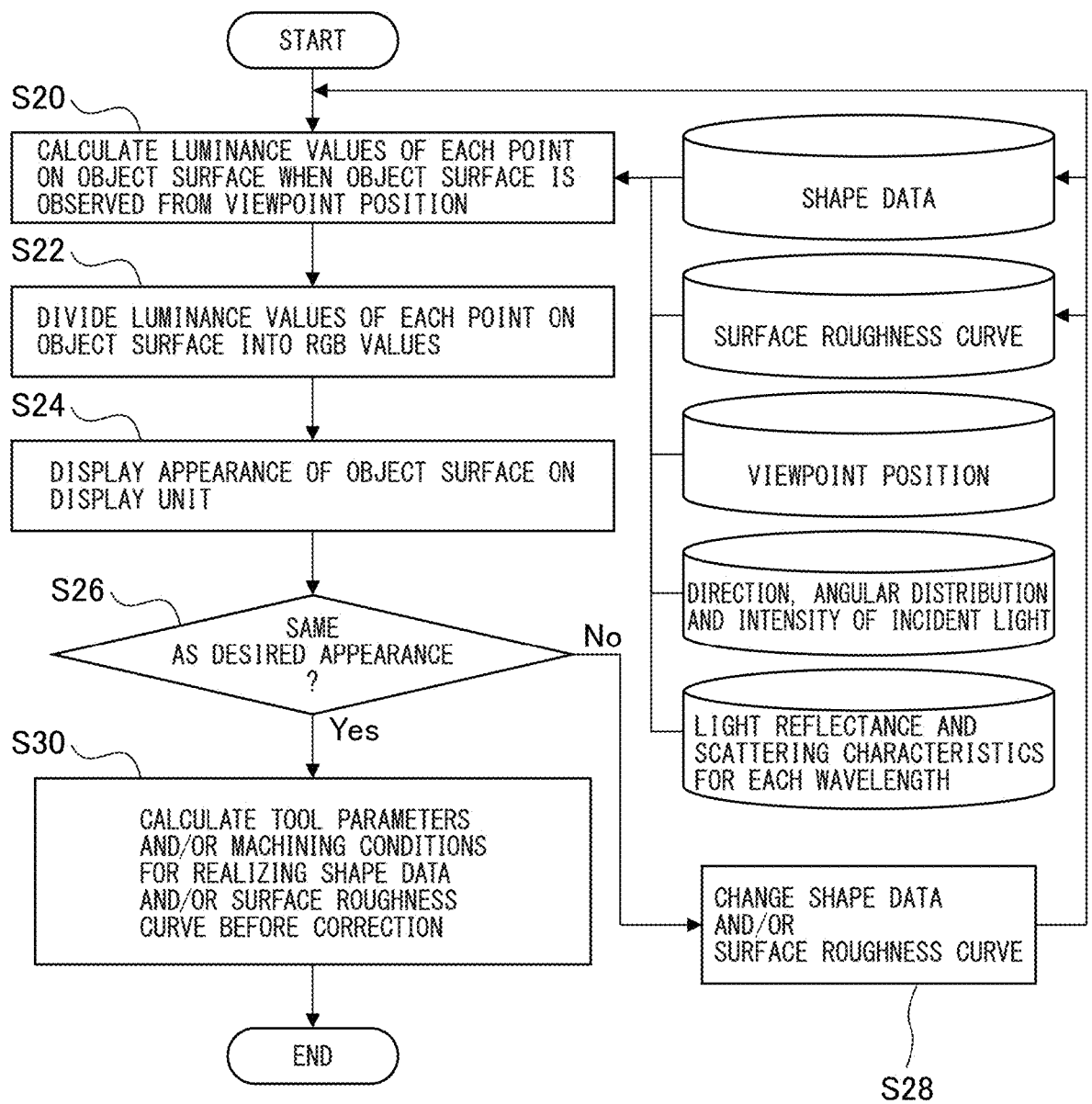
FIG. 12 is a flowchart showing an object surface correction method according to a preferred embodiment of the present invention.

FIG. 12 is a flowchart showing an object surface correction method according to a preferred embodiment of the present invention. In FIG. 12, the luminance calculation unit 16 reads the data from the data storage unit 14 and calculates the luminance for each point on the workpiece machined surface when observing the machined surface of the workpiece from the viewpoint position (step S20). the luminance calculated in the luminance calculation unit 16 is divided into the R (red), G (green), and B (blue) luminance values in consideration of the difference in reflectance of each wavelength of light incident on the workpiece machined surface in the RGB distribution unit 18. The workpiece machined surface is displayed on the output unit 20, for example, on a liquid crystal display or printed using a color printer, considering the characteristics of the workpiece machined surface (surface characteristics) such as surface roughness, reflectance, and scattering (step S24).

Next, a user, such as the operator of the machine tool, visually determines whether the displayed machined surface appears as intended and whether the desired aesthetic of the machined surface is obtained (step S26). If the displayed machined surface is not as intended (No in step S26),
the shape of the workpiece (shape of the machined surface) and/or the displayed roughness curve is changed (step S28), and the machined surface of workpiece is displayed again. This process is repeated until the machined surface attains the intended appearance (Yes in step S26).

When it is determined that the displayed machined surface has the desired appearance (Yes in step S26), the machining program, machining conditions, and parameters to produce the final shape data and/or surface roughness curve of the workpiece are calculated (step S30).

According to the present embodiment, as described above, prior to actually machining a workpiece, the shape of the workpiece (shape of machined surface), tool path, and machining conditions can be changed in the CAD device 102 and CAM device 104, and the set values of the acceleration/deceleration time constant, gain constant and other correction parameters of the NC device can be changed. By changing the machining conditions, tool conditions, and parameters input to the simulator, data related to shape of workpiece (object) and data related to surface roughness curve can be changed.

For example, by changing the tool diameter, it is possible to change the amplitude while maintaining the wavelength of the surface roughness curve of the machined surface. Alternatively, by changing the tool diameter and the pick feed, it is possible to change the wavelength while maintaining the amplitude of the surface roughness curve of the machined surface. By changing the set values of the acceleration/deceleration time constant, gain constant and other correction parameters of the NC device, the shape data can be changed, and by changing the machining conditions, such as the tool path and pick feed, and/or the tool conditions, such as the tool diameter, the surface roughness curve can be changed.

Other Examples will be described below.

Figure 13A:
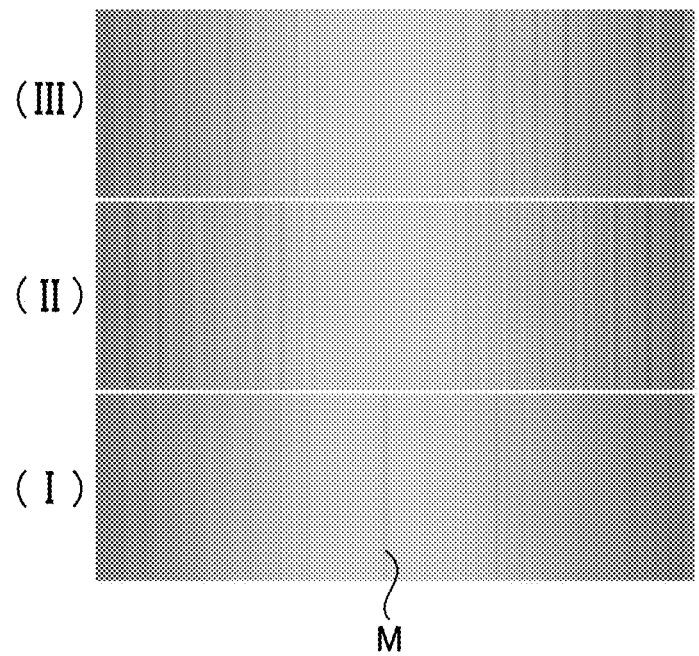
FIG. 13A is a photograph of a printout showing object surface prediction results according to the present invention when a backlash compensation amount as a correction parameter was changed.
Figure 13B:
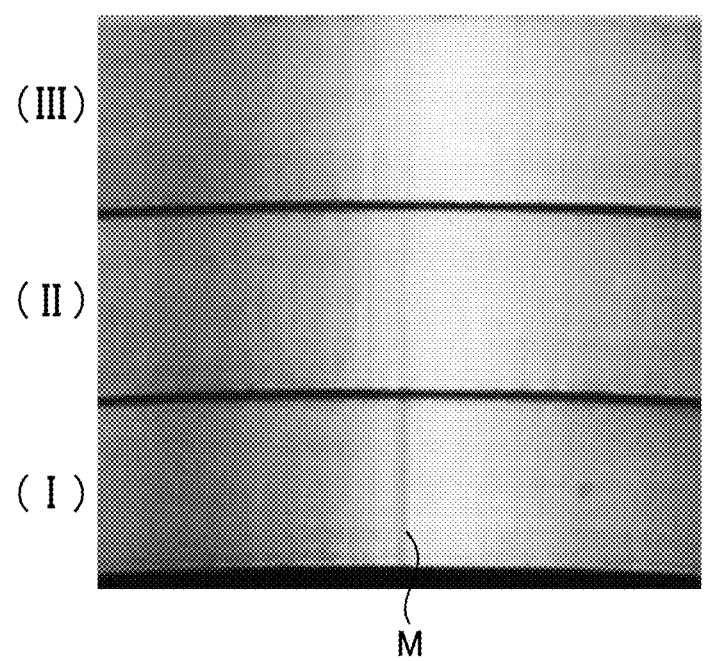
FIG. 13B is a captured photograph of a machined surface of a workpiece (object) actually produced under the same conditions as in FIG. 13A.

FIGS. 13A and 13B show examples in which a backlash compensation amount as a correction parameter has been changed. "Backlash compensation" means to add a position error component caused by the reversal of the direction of motion of the machine to the position command in advance in order to reduce the motion error accompanying the reversal of the direction of motion. The backlash compensation amount is a correction parameter that determines the position error to be added. FIG. 13A shows prediction results according to the present invention and FIG. 13B shows the results when machining was actually performed. In FIGS. 13A and 13B, (I), (II), and (III) show the cases in which the backlash compensation amount was 140, 53, and 31, respectively. The machining conditions, tool conditions, and parameters other than the backlash compensation amount were identical. In the prediction results according to the present invention shown in FIG. 13A, when the backlash compensation amount was 140 (I), streaks due to shape change were visible as indicated by the reference symbol "M". By correcting the backlash compensation amount to 53 (II) or 31 (III), prediction results in which the streaks were not present were obtained. As shown in FIG. 13B, similar results were obtained for actual machining results, confirming the effectiveness of the present invention.

Figure 14A:
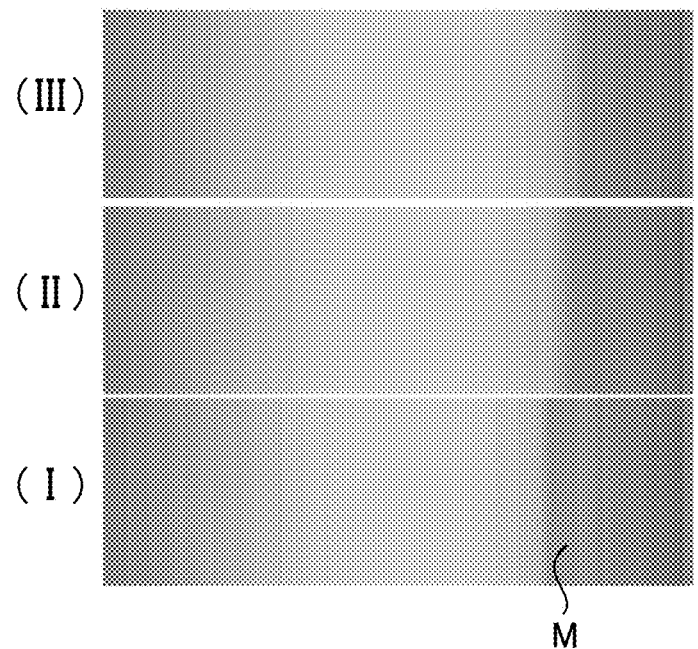
FIG. 14A is a photograph of a printout showing object surface prediction results according to the present invention when feed speed, which is a machining condition, was changed.
Figure 14B:
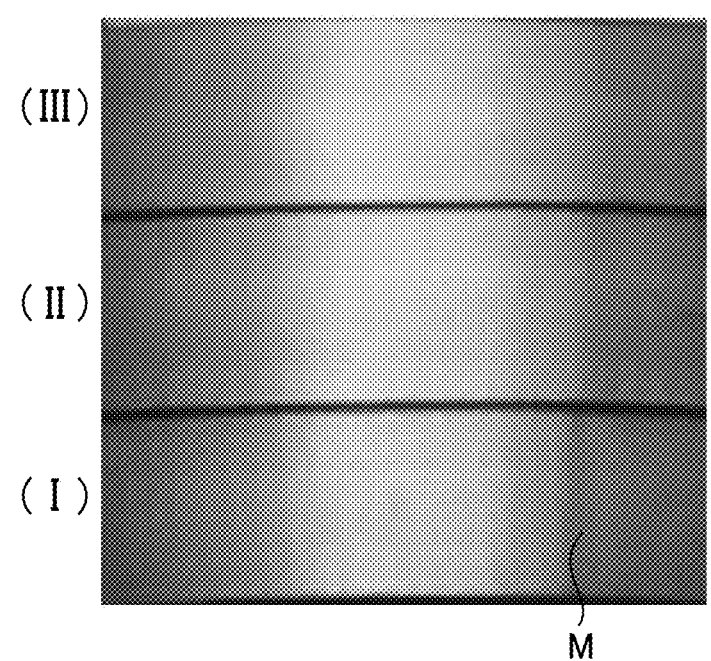
FIG. 14B is a captured photograph of a machined surface of a workpiece (object) actually produced under the same conditions as in FIG. 14A.

FIGS. 14A and 14B show examples in which the feed speed, which is a machining condition, was changed. The feed speed is the relative speed between the tool and the workpiece. FIG. 14A shows prediction results according to the present invention and FIG. 14B shows the results when machining was actually performed using the feed speed corresponding to prediction results. In FIGS. 14A and 14B, (I), (II), and (III) show the cases in the feed speed was 1000 mm/min, 2000 mm/min, and 3000 mm/min, respectively. The machining conditions, tool conditions, and parameters other than feed speed were identical. In the prediction results according to the present invention shown in FIG. 14A, when the feed speed was 1000 mm/min (I), streaks due to shape change were visible as indicated by reference symbol "M". When the feed speed was increased to 2000 mm/min (II) or 3000 mm/min (III), it was found that it was difficult to visually identify streaks. Even when a similar machining experiment was conducted, the same trend as the prediction results was confirmed as shown in (I) to (III) of FIG. 14B.

Figure 15A:
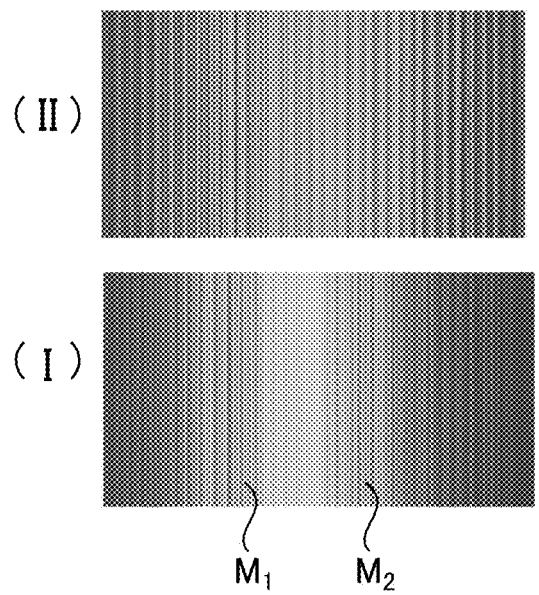
FIG. 15A is a photograph of a printout showing object surface prediction result according to the present application when the tool diameter, which is a tool condition, was changed.
Figure 15B:
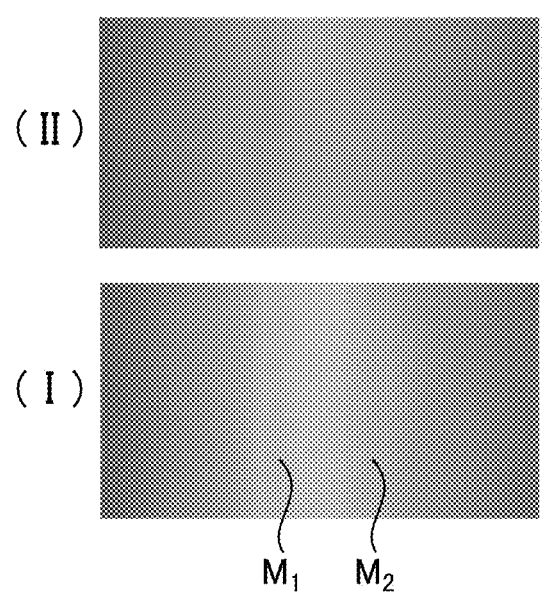
FIG. 15B is a captured photograph of a machined surface of a workpiece (object) actually produced under the same conditions as in FIG. 15A.

FIGS. 15A and 15B show examples in which the tool diameter, which is a tool condition, was changed. FIG. 15A shows prediction results when the tool diameter was 6 mm (I) or 2 mm (II) under the same machining conditions and parameters of a pick feed of 160 µm and a spindle rotation speed of 15000 $min^{-1}$. As a result, in the example in which the tool diameter was 6 mm (I), the arithmetic average roughness Ra of the machined surface was 0.2832 µm and in the example in which the tool diameter was 2 mm (II), the arithmetic mean roughness Ra of the machined surface was 0.8410 µm. FIG. 15B shows photographs of the machined surfaces of workpieces obtained by actually performing machining with a tool diameter of 6 mm (I) and 2 mm (II) under the same machining conditions and parameters.

In FIG. 15A, which shows prediction results according to the present application, when the tool diameter was 6 mm (I), Ra was 0.2832 µm, and two streaks due to shape change could be seen, as shown by reference symbols "$M_1$" and "$M_2$". Conversely, in the case of (II), when the tool diameter was 2 mm, Ra was 0.8410 µm, and it was found that it became difficult to observe the two streaks. Even when machining experiments were performed under the same conditions, the same trends as the prediction results as shown in FIG. 15B could be confirmed.

Thus, by predicting machined surface shape of the workpiece while changing the shape of the machined surface, the tool path, the machining conditions and changing the set values of the acceleration/deceleration time constant, the gain constant and other correction parameters of the NC device, it is possible to efficiently create the desired machined surface.

A specific example of a molding die in which the present invention is used will be described below. It takes several days to produce a molding die. Conventionally, parts of a molding die are produced after the die is designed. Thus, it is possible to evaluate the appearance of the produced molding die parts only after the parts have been produced. For that reason, when evaluation of appearance is unsatisfactory, it is necessary to redesign and re-produce the molding die as quickly as possible, which is a burden on engineers. Furthermore, it is difficult to recycle defective produced parts, leading to a large loss of materials.

Under such circumstances, according to the present invention, it is possible to predict the molding die design which will satisfy the appearance desired by a customer without producing the molding die parts. Even when the die parts are produced, it is possible to supply a molding die having a satisfactory appearance to the customer. According to the present invention, it is possible not only to reduce the required time and cost but it is also possible to easily and quickly design a molding die without being a skilled technician. Furthermore, the present invention can be usefully utilized in countries where there are few skilled technicians, such as in developing nations, the results of which are significant.

REFERENCE SIGNS LIST 10 prediction display device
12 input unit
14 data storage unit
16 luminance calculation unit
18 RGB distribution unit
20 output unit
100 machine tool
102 CAD device
104 CAM device
108 parameters
108 device
110 machining simulator

The invention claimed is:
1. An object surface, to be machined with a machine tool, correction method for predicting whether a shape of an object surface can be recognized by an observer and correcting the object surface based on the prediction, comprising:
preparing a test piece,
actually measuring, for the surface of the test piece, a machining shape, a surface roughness curve, a viewpoint position, direction and intensity of incident light on the surface of the test piece and the reflectance and scattering characteristics of each wavelength of light incident on the surface of the test piece,
repeatedly predicting and displaying the shape of the surface of the test piece, while changing the angular distribution of the incident light, based on data related to the actually measured machining shape, surface roughness curve, viewpoint position, direction and intensity of incident light on the surface of the test piece, and the reflectance and scattering characteristics of each wavelength of light incident on the surface of the test piece, and
calibrating the angular distribution of the incident light on the surface of the test piece so that the displayed surface shape of the test piece matches the surface shape of the test piece as visually observed by the observer,
dividing the object surface into a plurality of regions,
calculating, for each of the plurality of regions, a luminance of the object surface when the object surface is observed from the viewpoint position based on the data, related to shape of the object to be machined, the surface roughness curve, the viewpoint position, the incident light, and the reflected light,
predicting, based on the shape of the test piece and calculated luminance, whether the shape of the object surface can be recognized by the observer, and
correcting, based on the shape of the object surface, the data related to at least one of the shape of the object to be machined by the machine tool and surface roughness curve of the object.

2. The object surface correction method claim 1, wherein data related to at least one of the surface roughness curve of the object surface, incident light and reflected light can be measured.

3. A workpiece machining method for driving a machine tool to machine a workpiece based on a machining program generated by a CAM device for obtaining a desired workpiece shape, comprising:
repeatedly predicting and displaying the shape of a surface of a test piece while changing the angular distribution of incident light based on data related to machining shape, surface roughness curve, viewpoint position, direction and intensity of the incident light on the surface of the test piece and the reflectance and scattering characteristics of each wavelength of the light incident on the surface of the test piece, which are previously actually measured for the surface of the test piece, to calibrate the angular distribution of the incident light on the surface of the test piece so that the displayed surface shape of the test piece matches the surface shape of the test piece as visually observed by an observer,
dividing a machining surface of the workpiece into a plurality of regions,
calculating, for each of the plurality of regions, a luminance of the machining surface when the machining surface is observed from the viewpoint position based on the data relative to the shape of the object to be machined, the surface roughness curve, the viewpoint position, the incident light, and the reflected light,
predicting, based on the shape of the test piece and the calculated luminance, whether the shape of the machining surface can be recognized by the observer, and
correcting, based on the shape of the machining surface, the data related to at least one of the shape of the workpiece to be machined by the machine tool and surface roughness curve of the object, and
driving the machine tool based on the changed data to machine the workpiece.

4. The workpiece machining method claim 3, wherein the data related to the surface roughness curve includes tool conditions and machining conditions,
it is predicted whether the shape of the workpiece surface can be recognized by the observer and the tool conditions and the machining conditions are changed based on the prediction so as to obtain a desired workpiece surface shape,
a machining program is generated by the CAM device based on the changed tool conditions and machining conditions, and
the machine tool is driven by the generated machining program to machine the workpiece.

5. The workpiece machining method claim 3, wherein the data related to the surface roughness curve includes correction parameters of an NC device of a machine tool,
it is predicted whether the shape of the workpiece surface can be recognized by the observer and the correction parameters are changed based on the prediction so as to obtain a desired workpiece surface shape, and
the machine tool is driven by the changed correction parameters to machine the workpiece.

6. A machining system, comprising:
a machine tool, and
an object surface prediction display device configured to:
repeatedly predict and display the shape of a surface of a test piece while changing the angular distribution of incident light based on data related to machining shape, surface roughness curve, viewpoint position, direction and intensity of the incident light on the surface of the test piece and the reflectance and scattering characteristics of each wavelength of the light incident on the surface of the test piece, which are previously actually measured for the surface of the test piece, to calibrate the angular distribution of the incident light on the surface of the test piece so that the displayed surface shape of the test piece matches the surface shape of the test piece as visually observed by an observer,
divide a machining surface of a workpiece to be machined by the machine tool into a plurality of regions,
calculate, for each of the regions, a luminance of the machining surface when the machining surface is observed from the viewpoint position based on the shape of the workpiece, the surface roughness curve, the viewpoint position, the incident light, and the reflected light,
predict whether the shape of the machining surface can be recognized by the observer-based on the shape of the test piece and the calculated luminance, and
correct, based on the shape of the machining surface, the data related to at least one of the shape of the workpiece to be machined by the machine tool and the surface roughness curve based on the predicted shape of the machining surface, and
a controller for driving the machine tool based on the corrected data to machine the workpiece.

* * * * *